US009011654B2

(12) United States Patent
Ishino et al.

(10) Patent No.: US 9,011,654 B2
(45) Date of Patent: Apr. 21, 2015

(54) DUMMY SUBSTRATE, AND START METHOD OF, RETENTION/MODIFICATION METHOD OF DEPOSITION CONDITION, AND STOP METHOD OF DEPOSITION APPARATUS USING SAME

(75) Inventors: Koji Ishino, Chigasaki (JP); Hajime Nakamura, Chigasaki (JP); Mayako Matsuda, Chigasaki (JP); Takaaki Shindou, Chigasaki (JP); Yukio Kikuchi, Chigasaki (JP)

(73) Assignee: Ulvac, Inc., Chigasaki-shi (JP)

( * ) Notice: Subject to any disclaimer, the term of this patent is extended or adjusted under 35 U.S.C. 154(b) by 617 days.

(21) Appl. No.: 12/596,303

(22) PCT Filed: Apr. 16, 2008

(86) PCT No.: PCT/JP2008/057423
§ 371 (c)(1),
(2), (4) Date: Mar. 3, 2010

(87) PCT Pub. No.: WO2008/133139
PCT Pub. Date: Nov. 6, 2008

(65) Prior Publication Data
US 2010/0175990 A1 Jul. 15, 2010

(30) Foreign Application Priority Data

Apr. 18, 2007 (JP) .............................. P2007-109275

(51) Int. Cl.
*C23C 14/00* (2006.01)
*C25B 11/00* (2006.01)
(Continued)

(52) U.S. Cl.
CPC .............. *C23C 14/34* (2013.01); *C23C 14/564* (2013.01)

(58) Field of Classification Search
CPC .............. C23C 14/34; H01L 21/68778; H01L 21/68707; H01L 21/6838
USPC .......................... 204/192.12, 298.15; 428/596
See application file for complete search history.

(56) References Cited

U.S. PATENT DOCUMENTS 6,150,023 A * 11/2000 Yasaka et al. ................. 428/408
6,460,674 B1 * 10/2002 Clay ........................... 192/70.14
(Continued)

FOREIGN PATENT DOCUMENTS

JP 05070952 3/1993
JP 10265940 A * 10/1998 .............. C23C 14/04
(Continued)

OTHER PUBLICATIONS

Machine Translation JP2004-111550A.*
(Continued)

*Primary Examiner* — Keith Hendricks
*Assistant Examiner* — Ibrahime A Abraham
(74) *Attorney, Agent, or Firm* — Grossman, Tucker, Perreault & Pfleger, PLLC

(57) ABSTRACT

This dummy substrate is for use in an inline reactive sputtering apparatus. The main unit thereof is made of a rectangular-plate-like frame structure in which an opening portion in a rectangular shape is formed in a metal plate in a similar shape. It is configured such that a contact portion of a carrier with the main unit is covered with the main unit. As a result, even while the sputtering apparatus is in operation, there is no possibility of the occurrence of undesirable situations such as glass cracking, making it possible to significantly increase the number of times the dummy substrate is used. Furthermore, the dummy substrate continues to cover the contact portion with the carrier. Thereby, it is possible to prevent deposition of a substance left in a sputter deposition chamber, especially a compound thin film, on the contact portion of the carrier with the substrate. Therefore, it is possible to prevent undesirable situations such as an abnormal discharge due to the deposition of the compound thin film. As a result of these, it is possible to start (activate) an apparatus that deposits a compound thin film by the sputtering method, retain and modify a deposition condition in the apparatus, and stop (deactivate) the apparatus in a shorter time, and more efficiently and at a lower cost than before.

6 Claims, 5 Drawing Sheets

(51) Int. Cl.
*C25B 13/00* (2006.01)
*C23C 14/34* (2006.01)
*C23C 14/56* (2006.01)

(56) References Cited

U.S. PATENT DOCUMENTS 6,517,908 B1 * 2/2003 Thom ........................... 427/456
2002/0046946 A1 * 4/2002 Shimoda et al. ......... 204/298.25

FOREIGN PATENT DOCUMENTS

| JP | H11152564 | | | 6/1999 | | |
|---|---|---|---|---|---|---|
| JP | 2001093262 | A | * | 4/2001 | ............. | G11B 25/04 |
| JP | 2001176760 | A | * | 6/2001 | ............. | H01L 21/02 |
| JP | 200260938 | | | 2/2002 | | |
| JP | 2003229369 | | | 8/2003 | | |
| JP | 2004111550 | | | 4/2004 | | |

OTHER PUBLICATIONS

Machine Translation JP11-152564A.*
K. Burkland, DC Sputter Standard Operating Procedure, Oct. 28, 2003, http://www.nfc.umn.edu/sop/Bay-3/DC-Sputter.pdf.*
Machine translation of JP2001-176760.*
Machine translation of JP2001-093262A.*
International Search Report dated Jul. 8, 2008 issued in related International Patent Application No. PCT/JP2008/057423.

* cited by examiner

US 9,011,654 B2

DUMMY SUBSTRATE, AND START METHOD OF, RETENTION/MODIFICATION METHOD OF DEPOSITION CONDITION, AND STOP METHOD OF DEPOSITION APPARATUS USING SAME

TECHNICAL FIELD

The present invention relates to a dummy substrate, and to a start method of, a retention/modification method of a deposition condition, and a stop method of a deposition apparatus using the same. More particularly, the present invention relates to a dummy substrate for preferable use in an inline sputtering apparatus that deposits a compound thin film on surfaces of substrates by the sputtering method in a state with transfer devices holding the substrates being sequentially moved or stationary in a sputter deposition chamber. The dummy substrate is capable of starting the apparatus, retaining/modifying a deposition condition in the apparatus, and stopping the apparatus in a shorter time, with more efficiency, and at a lower cost. In addition, the present invention also relates to a start method of, a retention/modification method of a deposition condition, and a stop method of the deposition apparatus using the dummy substrate. Priority is claimed on Japanese Patent Application No. 2007-109275, filed on Apr. 18, 2007, the contents of which are incorporated herein by reference.

BACKGROUND ART

In conventional liquid crystal displays (LCDs), plasma displays panels (PDPs), and the like, a variety of sputtering apparatuses are proposed for sequentially depositing thin films such as transparent electrodes, dielectric films, insulating films, and the like with a uniform thickness on large-area glass substrates in large quantities. One of these apparatuses is an inline sputtering apparatus. In this apparatus, a plurality of sputtering cathodes are arranged in a line within its sputter deposition chamber.

While carriers (transfer devices) on which substrates are held are moved at a constant speed along the orientation direction of the sputtering cathodes, a target material ejected from the target is deposited on the substrates, to thereby form a desired thin film on the substrates. The apparatus is capable of sequentially depositing a thin film with a uniform thickness on large-area glass substrates in large quantities (Patent Document 1).

In the inline sputtering apparatus, it is required to simultaneously perform heating, sputtering, transfer of the carriers, and the like from the time of the activation (start) of the apparatus to the production, in order to fulfill the following objects (1) to (4).

(1) To stabilize the temperature distribution among the structures around the carriers and the target.

(2) To stabilize the degassing from the structures around the carriers and the target.

(3) To remove impurities attached to the surface of the target. This is generally referred to as pre-sputtering.

(4) To increase the discharge electric power of the target in a stepwise manner. This is generally referred to as ramp-up.

At the activation of such apparatuses, instead of a substrate used for a product, a glass plate with the same shape is used as a dummy substrate.

Furthermore, in manufacturing products different in specifications, it is required to modify the deposition conditions, the sputtering, the carrier transfer, and the like. Also in this case, instead of a substrate used for a product, a glass plate with the same shape is used as a dummy substrate.

Moreover, when maintenance of the apparatus is performed, problems can occur, or other times, it is required to cool the heated portion inside the apparatus approximately to room temperature, and then to open the vacuum region of the apparatus to air. The reason is that if the vacuum region is opened to air at temperatures not less than 100° C., the surface of the heated portion in the vacuum region is oxidized, making the environment in the subsequent sputtering unstable.

Thus, the activation or deactivation (stop) of the apparatus takes a considerable time. Therefore, for example, if a delay in delivery of substrates for products has caused a disruption of supply of substrates to the apparatus during normal production operation, the deposition conditions, the sputtering, the carrier transfer, and the like are often retained in order to nullify the time required for stopping and reactivating the apparatus for swift resumption of the production.

In such retention of the apparatus, instead of a substrate used for a product, a glass plate with the same shape is used as a dummy substrate. Recent years have seen proposals of dummy substrates using a metal plate made of a nickel-based alloy such as Inconel, a nickel-plated material, aluminum, or the like instead of a glass substrate (Patent Documents 2 and 3).

Patent Document 1: Japanese Unexamined Patent Publication, First Publication No. 2002-60938

Patent Document 2: Japanese Unexamined Patent Publication, First Publication No. 2003-229369

Patent Document 3: Japanese Unexamined Patent Publication, First Publication No. H11-152564

Here, conventional inline sputtering apparatuses have the following problems because they use a glass substrate as a dummy substrate at the time of the activation and the deactivation of the apparatus, or at the time of the retention/modification of deposition conditions:

(1) In the case of the activation of the apparatus and the retention/modification of deposition conditions, the stress of the deposition increases as the amount of deposition on the glass substrate increases. As a result, this makes the load on the glass substrate higher, leading to a problem in that glass cracking and the like may occur at the time of the deposition, the carrier transfer, and the attachment/detachment to/from the carrier. In the case where a glass substrate is used as a dummy substrate, the number of times it is used is normally limited to approximately six or seven, although the number of uses slightly varies according to apparatuses and the like.

(2) The activation and deactivation of the apparatus each takes several hours. An occurrence of problems such as glass cracking results in a long stop time of the apparatus, leading to not only a problem of reduction in productivity, but also a problem in that a delay in delivery of products may be caused.

Especially in a production line operated for 24 consecutive hours or the like, the number of times a single dummy substrate is used is reduced to prevent a problem such as glass cracking. Therefore, a multitude of dummy substrates are required.

In recent years, due to the upsizing of a glass substrate resulting from the upsizing of the panel size of the liquid crystal displays (LCDs) and the plasma display panels (PDPs), dummy substrates have been upsized. Therefore, a problem such as glass cracking is also a cause of an increase in the cost of the dummy substrate.

Furthermore, in a conventional dummy substrate for which a metal plate is used, a heavier load is imposed on the carrier because metal has a specific gravity larger than that of a glass plate, although the metal plate is free from a problem such as glass cracking. To address this, if a metal plate with the same weight as that of the glass plate is to be used, it is required to make the metal plate very thin, leading to a new problem of insufficient strength and the like.

DISCLOSURE OF INVENTION

The present invention has been achieved to solve the above problems, and has an object to provide a dummy substrate capable of activating (starting) an apparatus that forms a compound thin film by the sputtering method, retaining/modifying a deposition condition, and deactivating (stopping) the apparatus in a shorter time, and also more efficiently and at a lower cost than before, and to provide a start method of, a retention/modification method of a deposition condition, and a stop method of a deposition apparatus using the same.

As a result of an examination of operations of an inline sputtering apparatus that deposits a compound thin film by the sputtering method, the present inventor has found that, if a metal plate with an opening portion formed therein is used as a dummy substrate, and a contact portion of a carrier (transfer device) with the dummy substrate is covered with the dummy substrate, it is possible to start (activate) the sputtering apparatus, to retain/modify a deposition condition, and to stop (deactivate) the sputtering apparatus in a shorter time, and also more efficiently and at a lower cost than before. This has led to completion of the present invention.

That is, a dummy substrate of the present invention is a dummy substrate for use in an apparatus where a plurality of transfer devices for holding substrates are arranged in a sputter deposition chamber in a line along one direction on surfaces of the substrates and where a compound thin film is deposited on the surfaces of the substrates by a sputtering method in a state with the transfer devices being sequentially moved or being stationary, the dummy substrate being used instead of any of the substrates, including a main unit portion that is a plate-like structure made of metal with an opening portion formed therein, at least a contact portion of the transfer device with the main unit portion being covered with the main unit portion.

In the dummy substrate, the main unit portion is a plate-like structure made of metal in which an opening portion is formed. Therefore, even while the apparatus is in operation, there is no possibility of the occurrence of undesirable situations such as glass cracking, thus increasing the number of times the dummy substrate is used.

As a result, this makes it possible to reduce the stop time in each case of a start (activation) of the apparatus, a retention/modification of a deposition condition, and a stop (deactivation) of the apparatus, thus enhancing the availability of the apparatus.

Furthermore, at least the contact portion of the transfer device with the main unit portion is covered with the main unit portion. This keeps a compound thin film from being deposited on the contact portion of the transfer device with the main unit, thus eliminating the possibility of the occurrence of undesirable situations such as an abnormal discharge due to the deposition of the compound thin film on the transfer device.

In the dummy substrate, the main unit portion may have an outer peripheral shape equivalent to that of the substrate, and also, may have a weight equivalent to that of the substrate.

In the dummy substrate, the main unit portion has an outer peripheral equivalent to that of the substrate and has a weight equivalent to that of the substrate. Thereby, various conditions, such as operational conditions and conditions when the apparatus is activated, when the deposition conditions are retained/modified, when the apparatus is deactivated, and other times, are made equivalent to those for the substrate, thus eliminating additional operations such as readjustment of the various conditions. Furthermore, in the dummy substrate, a metal substrate has a specific gravity larger than that of a glass substrate. Therefore, if the dummy substrate is to be made equivalent in weight to a glass plate in order to prevent an application of more load onto a carrier, the necessity of making the metal plate very thin is eliminated because the dummy substrate is a plate-like structure made of metal with an opening portion formed therein. Consequently, it is possible to achieve a mass equivalent to that of a glass plate without bringing about a problem of insufficient strength or the like. That is, with the opening portion being designed in an appropriate size, it is also possible to make the main unit portion of the dummy substrate equivalent to the substrate in outer peripheral shape, mass, and thickness. As a result, various conditions, such as operational conditions and conditions when the apparatus is activated, when the deposition conditions are retained/modified, when the apparatus is deactivated, and other times, are made further equivalent to those for the substrate, thus eliminating additional operations such as readjustment of the various conditions.

In the dummy substrate, of the main unit portion, a surface roughness Ra of at least the contact portion with the transfer device may be not more than 3.2 µm.

In the dummy substrate, of the main unit portion, a surface roughness Ra of at least the contact portion with the transfer device is not more than 3.2 µm. This brings about a close contact state of the contact portion between the dummy substrate and the transfer device, causing the contact portion to be airtightly covered with the dummy substrate. As a result, a compound thin film and the like are kept from being attached to the contact portion, preventing undesirable situations such as an abnormal discharge due to the deposition of the compound thin film on transfer device.

Furthermore, it becomes possible to perform attachment/detachment of the dummy substrate to/from the transfer device in a similar manner for the attachment/detachment of the substrate.

A second aspect according to the present invention is a start method of a deposition apparatus using the dummy substrate of the present invention, including: arranging, in a sputter deposition chamber, a plurality of transfer devices holding the dummy substrates in a line along one direction on surfaces of the dummy substrates; changing a deposition condition in a state with the transfer devices being sequentially moved or being stationary; and then stabilizing the deposition condition into a desired deposition condition.

In the start method of the deposition apparatus, a plurality of transfer devices holding the dummy substrates of the present invention are arranged in a sputter deposition chamber in a line along one direction on surfaces of the dummy substrates; a deposition condition is changed in a state with the transfer devices being sequentially moved or being stationary; and then the deposition condition is stabilized into a desired deposition condition. Thereby, there is no possibility of the occurrence of undesirable situations such as glass cracking in all the cases of the deposition at the start of the apparatus, the transfer of the carriers, and the attachment/detachment to/from the carriers. Therefore, it is possible to start the apparatus in a short time.

Furthermore, with the dummy substrate of the present invention, the number of times the dummy substrate is used in increased, and the cost of the dummy substrate itself is reduced.

As a result, the productivity of the apparatus is improved, and the cost involved in the start operation is reduced.

A third aspect according to the present invention is a method of retaining or modifying a deposition condition of a deposition apparatus using the dummy substrate of the present invention, including: causing a plurality of transfer devices for holding substrates to hold the dummy substrates after a main sputtering; arranging, in a sputter deposition chamber, the transfer devices holding the dummy substrates in a line along one direction on surfaces of the dummy substrates; retaining or modifying a deposition condition in a state with the transfer devices being sequentially moved or being stationary; and then replacing the dummy substrates with desired substrates, and performing a main sputtering.

In the retention or modification method of a deposition condition of a deposition apparatus, a plurality of transfer devices are caused to hold the dummy substrates after a main sputtering; a deposition condition is retained or modified in a state with the transfer devices being sequentially moved or being stationary; and then the dummy substrates is replaced with desired substrates, and a main sputtering is performed. Thereby, when a deposition condition is retained or modified, there is no possibility of the occurrence of the undesirable situations such as glass cracking in all the cases of the deposition at the start of the apparatus, the transfer of the carriers, and the attachment/detachment to/from the carriers. Therefore, it is possible to retain or modify a deposition condition in a short time.

Furthermore, with the dummy substrate of the present invention, the number of times the dummy substrate is used is increased, and the cost of the dummy substrate itself is reduced.

As a result, the productivity of the apparatus is improved, and the cost involved in the retention/modification of a deposition condition is reduced.

A third aspect according to the present invention is a stop method of a deposition apparatus using the dummy substrate of the present invention, includes: arranging, in a sputter deposition chamber, a plurality of transfer devices holding the dummy substrates in a line along one direction on surfaces of the dummy substrates; cooling an inside of the sputter deposition chamber in a state with the transfer devices being sequentially moved or being stationary; and then stopping the deposition apparatus.

In the stop method of a deposition apparatus, the inside of the sputter deposition chamber is cooled in a state with the transfer devices with the dummy substrates held thereon being sequentially moved or being stationary. Thereby, also in the cooling process, the dummy substrate continues to cover the contact portion of the transfer device with the substrate. As a result, a substance left in the sputter deposition chamber, especially a compound thin film, is kept from being deposited on the contact portion of the transfer device with the substrate.

According to the dummy substrate of the present invention, there is provided a main unit portion that is a plate-like structure made of metal with an opening portion formed therein. Therefore, even while the apparatus is in operation, there is no possibility of the occurrence of undesirable situations such as glass cracking, thus increasing the number of times the dummy substrate is used.

Consequently, this makes it possible to reduce or nullify the stop time in the case of the start (activation) of the apparatus, the retention/modification of a deposition condition, and the stop (deactivation) of the apparatus, thus enhancing the availability of the apparatus.

Furthermore, at least the contact portion of the transfer device with the main unit portion is covered with the main unit portion. This can prevent a compound thin film from being deposited on the contact portion of the transfer device with the main unit. Therefore, it is possible to prevent undesirable situations such as an abnormal discharge due to the deposition of the compound thin film on the transfer device.

According to the start method of the deposition apparatus of the present invention, a plurality of transfer devices holding the dummy substrates of the present invention are arranged in a line along one direction on surfaces of the dummy substrates; a deposition condition is changed in a state with the transfer devices being sequentially moved or being stationary; and then the deposition condition is stabilized into a desired deposition condition. This can prevent a compound thin film from being deposited on the contact portion of the transfer device with the main unit. Therefore, it is possible to prevent undesirable situations such as an abnormal discharge due to the deposition of the compound thin film on the transfer device. Consequently, it is possible to start (activate) the apparatus in a shorter time, and also more efficiently and at a lower cost than before.

According to the retention/modification method of a deposition condition in a deposition apparatus of the present invention, a plurality of transfer devices are caused to hold the dummy substrates of the present invention after a main sputtering; the transfer devices holding the dummy substrates are arranged in a sputter deposition chamber in a line along one direction on surfaces of the dummy substrates; and a deposition condition is retained or modified in a state with the transfer devices being sequentially moved or being stationary. This can prevent a compound thin film from being deposited on the contact portion of the transfer device with the main unit. Therefore, it is possible to prevent undesirable situations such as an abnormal discharge due to the deposition of the compound thin film on the transfer device. Consequently, it is possible to retain or modify a deposition condition in a shorter time, and also more efficiently and at a lower cost than before.

According to the stop method of a deposition apparatus of the present invention, a plurality of transfer devices holding the dummy substrates of the present invention are arranged in a sputter deposition chamber in a line along one direction on surfaces of the dummy substrates; and an inside of the sputter deposition chamber is cooled in a state with the transfer devices being sequentially moved or being stationary. Thereby, also in the cooling process, the dummy substrate continues to cover the contact portion of the transfer device with the dummy substrate. This can prevent deposition of a substance left in the sputter deposition chamber, especially a compound thin film, on the contact portion of the transfer device with the dummy substrate, and can prevent undesirable situations such as an abnormal discharge due to the deposition of the compound thin film. As a result, it is possible to improve the productivity of the apparatus.

DESCRIPTION OF THE REFERENCE SYMBOLS

Figure 1:
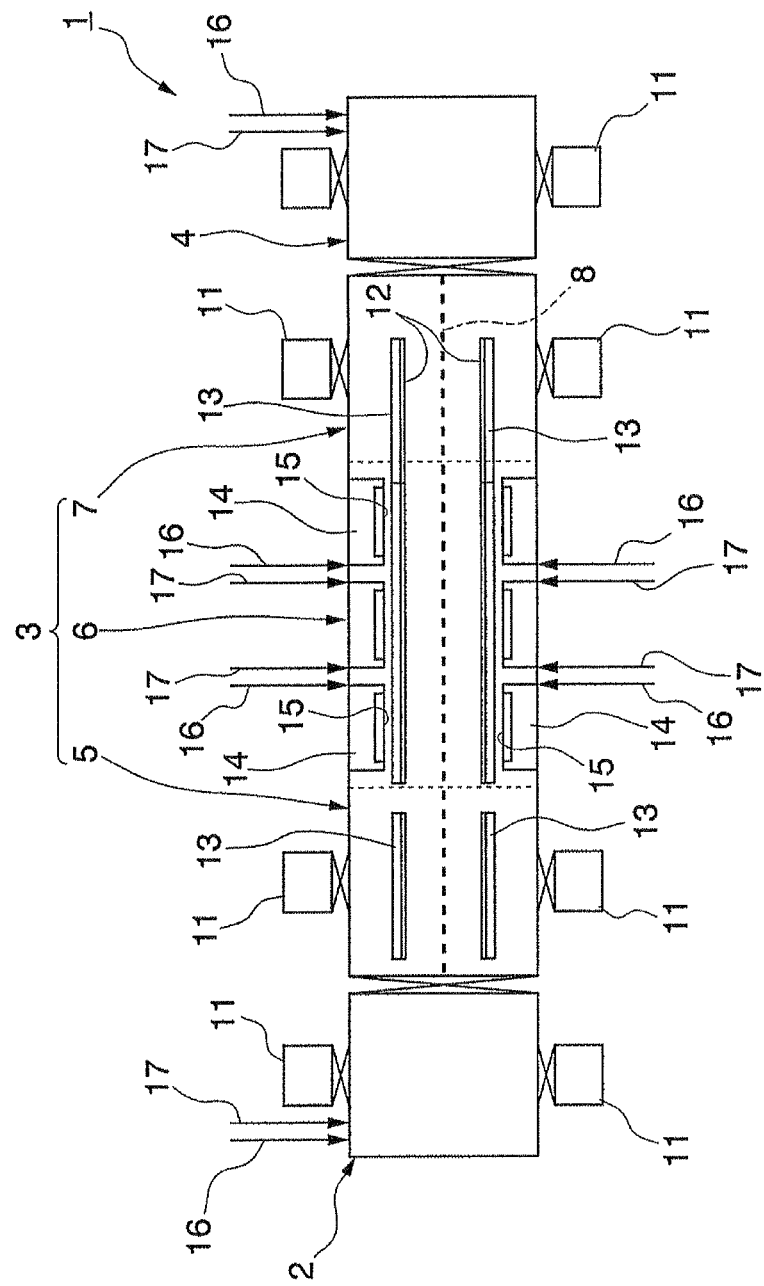
FIG. 1 is a schematic diagram showing an inline reactive sputtering apparatus according to one embodiment of the present invention.

1: sputtering apparatus, 2: anterior chamber, 3: sputter deposition chamber, 4: posterior chamber, 5: inlet side zone, 6: sputtering zone, 7: outlet side zone, 11: vacuum pump, 12: carrier, 13: dummy substrate, 14: sputtering cathode, 15: target, 16: inactive gas introduction pipe, 17: reactive gas introduction pipe, 21: main unit, 22: opening, 23:clamp, 24: substrate bracket, 25: holder main unit, 31: clamp main unit, 31a: tip portion, 32: shaft, 33: reception portion, 34: pressing portion, 41: concave portion, 42: reception portion, 43: bolt, 44: blade spring, 51: main unit, 52: metal plate, 53 opening portion, 54: adsorption portion, 61: dummy substrate, 62: bar

BEST MODE FOR CARRYING OUT THE INVENTION

The best mode for carrying out a dummy substrate according to the present invention, and a start method of, a retention/modification method of a deposition condition, and a stop method of the deposition apparatus using the same will be described, with reference made to an inline reactive sputtering apparatus, one type of deposition apparatus, by way of example.

Note that this mode is for a specific description for a better understanding of the spirit or scope of the invention, and hence, is not to be considered as limitative of the invention unless otherwise specified.

Furthermore, in the drawings used in the following description, scale ratios among the constituent elements are appropriately modified to make their size recognizable.

FIG. 1 is a schematic diagram showing an inline reactive sputtering apparatus to which a dummy substrate according to one embodiment of the present invention is applied.

The sputtering apparatus 1 is made of: an anterior chamber 2; a sputter deposition chamber 3; and a posterior chamber 4 that is also used as a reversing chamber. The sputter deposition chamber 3 is made of three zones: an inlet side zone 5, a sputtering zone 6, and an outlet side zone 7. At a central position in the width direction of the inlet side zone 5, the sputtering zone 6, and the outlet side zone 7, there is provided a partition plate 8 for separating these zones into two systems: a forward cycle (lower side in FIG. 1) and a return cycle (upper side in FIG. 1).

In the sputtering apparatus 1, the anterior chamber 2 functions as a posterior chamber and the posterior chamber 4 functions as an anterior chamber in the case of the return cycle. Here, for convenience sake, the chambers are referred to as anterior chamber 2 and posterior chamber 4, respectively, with reference to the case of the forward cycle.

There is provided a vacuum pump 11 on each of the anterior chamber 2, the inlet side zone 5 and the outlet side zone 7 of the sputter deposition chamber 3, and the posterior chamber 4. In each of the forward cycle and the return cycle in the zones 2 to 4, a plurality of carriers (transfer devices) 12 each for transferring a substrate are arranged so as to be in succession. Each of the carriers 12 is capable of moving in the zones 2 to 4 in their arrangement direction (in the left-right direction in FIG. 1) and is also capable of being held at a predetermined position. At the predetermined position of every carrier 12, a glass substrate (not shown in the figure) to be made into a product or a dummy substrate 13 is held in a manner erected substantially vertically.

On the other hand, on both side walls in the sputtering zone 6, there are provided a plurality of sputtering cathodes 14 along the movement direction of each carrier 12 in both of the forward cycle and the return cycle. To the sputtering cathodes 14, there is attached a target 15, which is a sputtering material for a compound thin film. Each of the targets 15 is positioned so as to be opposed to a front surface of each glass substrate (not shown in the figure) or dummy substrate 13 that is attached at a predetermined position of each carrier 12 with a predetermined distance spaced apart from each other.

In the vicinity of the sputtering cathodes 14, there are arranged: inactive gas introduction pipes 16 for introducing an inactive gas such as Ar; and reactive gas introduction pipes 17 for introducing a reactive gas such as $O_2$. The pipes are directed toward the carriers 12.

Furthermore, also in each of the anterior chamber 2 and the posterior chamber 4, there are provided an inactive gas introduction pipe 16 and a reactive gas introduction pipe 17.

Figure 2:
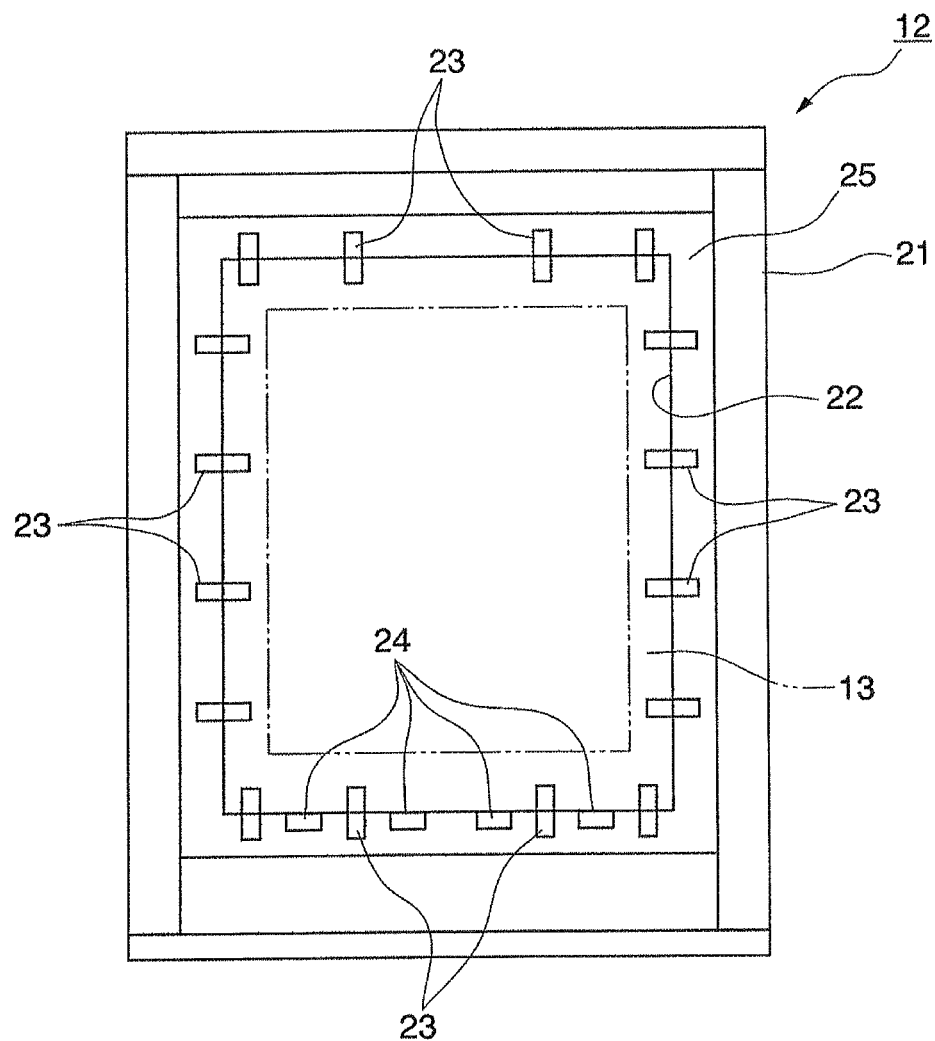
FIG. 2 is a plan view showing a carrier of the inline reactive sputtering apparatus according to the embodiment of the present invention.

In the carrier 12, as shown in FIG. 2, at a central portion of a main unit 21 formed of a rectangular-plate-like frame structure made of aluminum, there is provided a holder main unit 25 also formed of a rectangular-plate-like frame structure made of titanium. Furthermore, there is provided an opening 22 for holding a glass substrate to be made into a product (not shown in the figure) or a dummy substrate 13. On a peripheral portion on the opening 22 side of the main unit 21, there are provided a plurality of (16, in FIG. 2) clamps 23, one type of holder for holing a glass substrate or a dummy substrate 13, spaced a predetermined distance from each other. Furthermore, on a peripheral portion on the opening 22 side in a lower part of the holder main unit 25, there are provided a plurality of (four, in FIG. 2) substrate brackets 24 so as to place the two clamps 23 therebetween.

Figure 3:
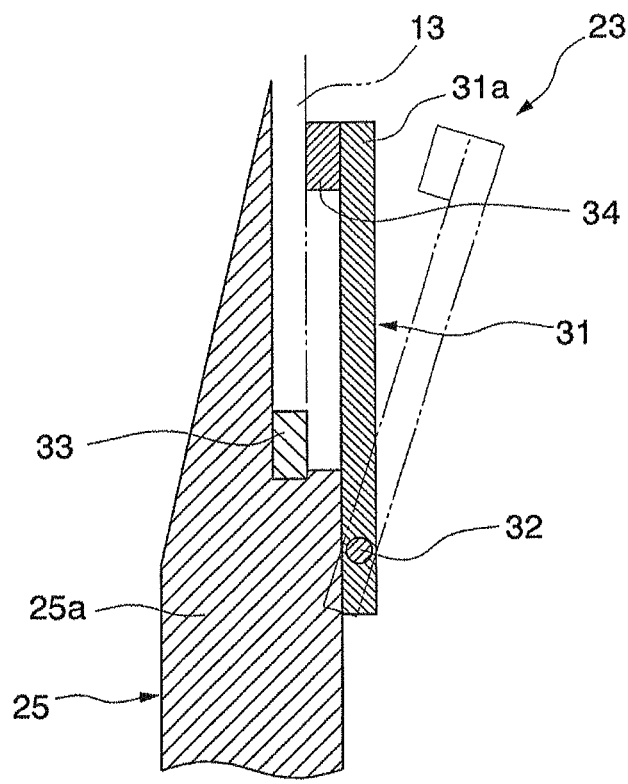
FIG. 3 is a cross-sectional view showing a clamp of the carrier of the inline reactive sputtering apparatus according to the embodiment of the present invention.

In the clamp 23, as shown in FIG. 3, a clamp main unit 31 made of metal is provided on a tip portion 25a of a holder main unit 25 in a manner rotatable about a shaft 32. On the tip portion 25a, there is provided a reception portion 33 made of a hard resin for holing a glass substrate or a dummy substrate 13. On a tip portion 31a of the clamp main unit 31, there is provided a pressing portion 34 made of a hard resin for pressing and holding the glass substrate or the dummy substrate 13.

In the clamp 23, a glass substrate or a dummy substrate 13 is mounted on the reception portion 33 in a state with the pressing portion 34 being spaced apart from the tip portion 25a of the holder main unit 25 as a result of the clamp main unit 31 being rotated outwardly about the shaft 32. Subsequently, the clamp main unit 31 is rotated about the shaft 32 toward the tip portion 25a side of the holder main unit 25, to thereby press the glass substrate or the dummy substrate 13 with the pressing portion 34. As a result, it is possible to hold the glass substrate or the dummy substrate 13 at a predetermined position. Furthermore, an outward rotation of the clamp main unit 31 about the shaft 32 releases the glass substrate or the dummy substrate 13 from the clamp 23, allowing for its removal from the carrier 12.

Figure 4:
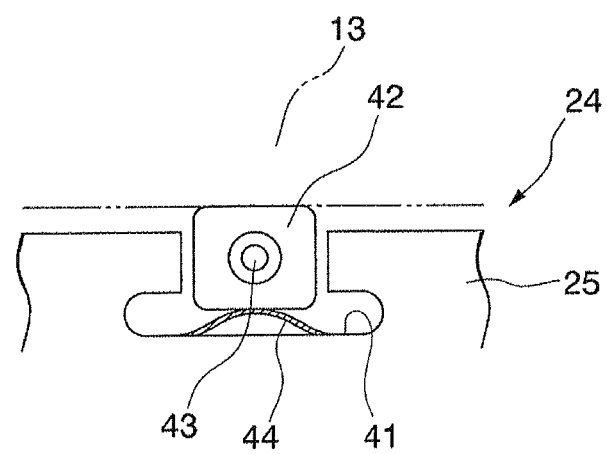
FIG. 4 is a front view showing a substrate bracket of the carrier of the inline reactive sputtering apparatus according to the embodiment of the present invention.

In the substrate bracket 24, as shown in FIG. 4, a square-plate-like reception portion 42 made of a hard resin is mounted in a concave portion 41 formed in the peripheral portion on the opening 22 side in the lower part of the holder main unit 25 by means of a bolt 43, which is movably placed in a long opening (not shown in the figure) of the main unit 21, and a blade spring 44. The reception portion 42 is movable along a direction toward the opening 22 (in the up-down direction in FIG. 4).

Figure 5:
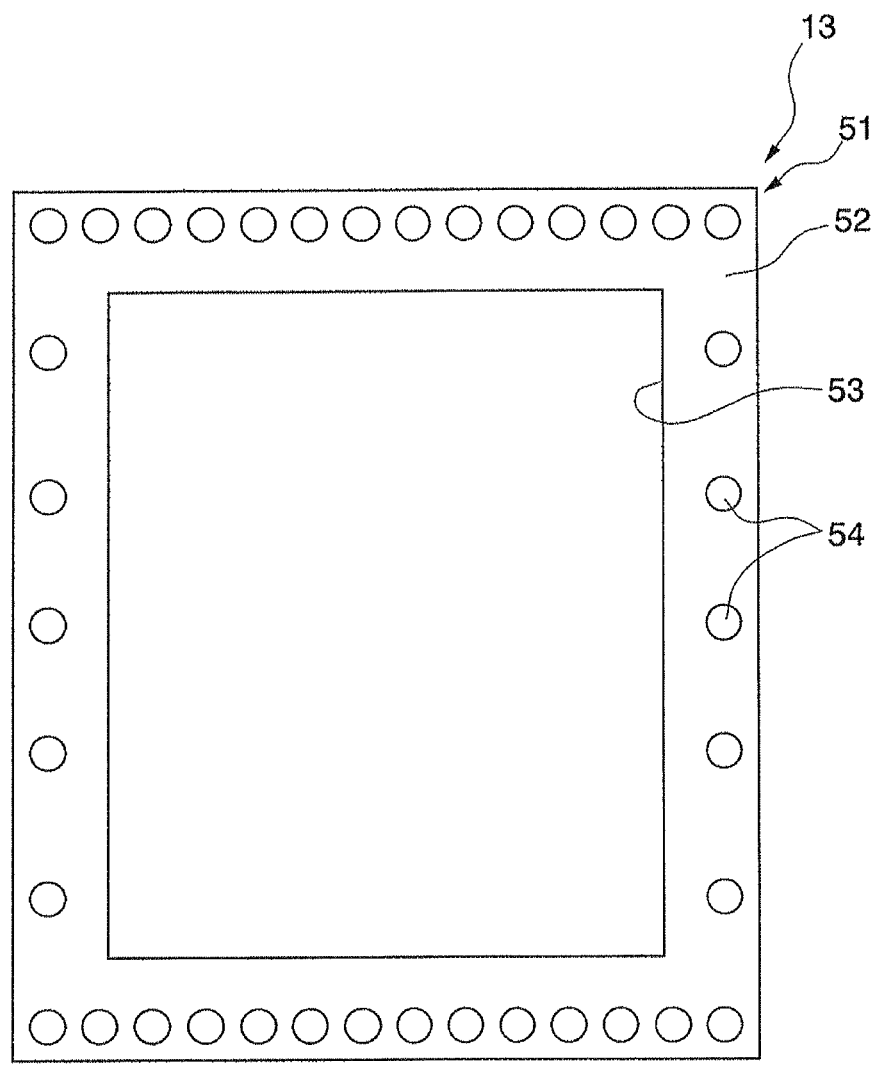
FIG. 5 is a front view showing a dummy substrate according to the embodiment of the present invention.

The dummy substrate 13, as shown in FIG. 5, has a main unit 51 with an outer peripheral shape equivalent to that of a glass substrate to be made into a product and also with a weight equivalent to that of the glass substrate.

Here, "with a weight equivalent to that of the glass substrate" means having a weight in the range of ±50% of the weight of the glass substrate.

With the weight of the dummy substrate 13 being equivalent to that of the glass substrate, it is possible to move the carrier 12 with stability.

The dummy substrate 13 is made of a rectangular-plate-like frame structure in which an opening portion 53 with a rectangular shape is formed in a metal plate 52 with a similar shape. It has a so-called picture frame shape. A contact portion of the carrier 12 is configured to be covered with the main unit 51.

As a metal used for the main unit 51, a metal with a coefficient of linear expansion close to that of the glass substrate is preferable. Here, a coefficient of linear expansion close to that of the glass substrate ($3.0 \times 10^{-6}$/° C. to $4.0 \times 10^{-6}$/° C.) refers to a coefficient of linear expansion in the range of ±400% of the coefficient of linear expansion of the glass substrate.

Furthermore, the specific gravity of the metal is not particularly limited. However, it is assumed that the metal has a frame structure and is not affected by the wind when it is handled. Therefore, the metal is allowed to have a specific gravity up to 1.6 times that of the glass substrate to be made into a product.

Such metals include, for example, pure titanium (specific gravity: 4.51 g/cm$^3$, coefficient of linear expansion: $8.40 \times 10^{-6}$/° C., hereinafter the same applies), a titanium alloy (specific gravity: 4.43 g/cm$^3$, coefficient of linear expansion: $8.80 \times 10^{-6}$/° C.), a nickel-based alloy such as a 42 alloy (specific gravity: 8.15 g/cm$^3$, coefficient of linear expansion: $4.50 \times 10^{-6}$/° C.), a tungsten alloy such as Heavy Alloy HAX1 (specific gravity: 18.1 g/cm$^3$, coefficient of linear expansion: $4.90 \times 10^{-6}$/° C.), stainless steel such as SUS405 (specific gravity: 7.7 g/cm$^3$, coefficient of linear expansion: $10.40 \times 10^{-6}$/° C.), iron or an iron-based alloy (specific gravity: 9 g/cm$^3$, coefficient of linear expansion: $11.20 \times 10^{-6}$/° C.), aluminum or an aluminum alloy (specific gravity: 2.68 g/cm$^3$, coefficient of linear expansion: $23.80 \times 10^{-6}$/° C.), a magnesium alloy (specific gravity: 1.78 g/cm$^3$, coefficient of linear expansion: $28.80 \times 10^{-6}$/° C.), chromium (specific gravity: 7.19 g/cm$^3$, coefficient of linear expansion: $6.20 \times 10^{-6}$/° C.), vanadium (specific gravity: 6.1 g/cm$^3$, coefficient of linear expansion: $8.30 \times 10^{-6}$/° C.). Furthermore, a nonmetal, silicon (specific gravity: 2.33 g/cm$^3$, coefficient of linear expansion: $5.00 \times 10^{-6}$/° C.), which is a material for semiconductors can be used.

Other than these, gadolinium, dysprosium, terbium, germanium, praseodymium, lanthanum, zirconium, or the like can be used.

On a peripheral portion of the main unit 51, there are formed a plurality of (38, in FIG. 5) adsorption portions 54 which are to be contacted by adsorption pads (not shown in the figure) of the carrier 12, at positions corresponding to the positions of the adsorption pads.

The dummy substrate 13 is attached/detached to/from the carrier by use of a transfer machine (a robot) with the same specifications as those of a transfer machine (a robot) for product substrates. Therefore, it is desirable that the weight of the dummy substrate be in the range of 80 to 120% of the weight of the product substrate.

A surface roughness Ra of the adsorption portions 54 at which the plurality of adsorption pads on the hand of the aforementioned robot adsorb on the dummy substrate 13 is preferably not more than 3.2 µm, more preferably not more than 0.5 µm.

Here, the reason for the surface roughness of the adsorption portion 54 being limited to not more than 3.2 µm is that, if the surface roughness Ra is not more than 3.2 µm, the contact with the adsorption mechanism of the carrier 12 is made closer, and hence, the adsorption force between the dummy substrate 13 and the carrier 12 is increased to a predetermined adsorptive force or greater, securing the reliability of the vacuum adsorption. Furthermore, this is for preventing the dummy substrate 13 from damaging the adsorption pads made of a resin.

For example, if the adsorption pads of the carrier 12 have a diameter of 32 mm and corresponding adsorption portions 54 have a surface roughness Ra of 3.2 µm, then the adsorption portion 54 has a diameter of 50 mm Furthermore, if taking the effect by the wind in handling, weathering of the adsorption pads, and the like into consideration, a margin of the adsorptive force of the adsorption pad can be represented by a safety ratio of the glass substrate to the total weight. For example, if the dummy substrate 13 has a weight of approximately 13 kg and the glass substrate has a weight of 12 kg, then the whole of the adsorption pads have an adsorptive force of 30.156 kg. Therefore, the margin of the adsorptive force of the whole adsorption pads can be represented by 2.5, a safety ratio of the glass substrate to the whole weight.

In the carrier, the bottom portion of the substrate is supported by the substrate brackets made of a resin. For the prevention of damage to the substrate brackets, it is preferable that an edge portion of the outer periphery (at least a part on the lower side of the carrier supported by the substrate brackets) of the dummy substrate be formed in a semicircle.

Figure 6:
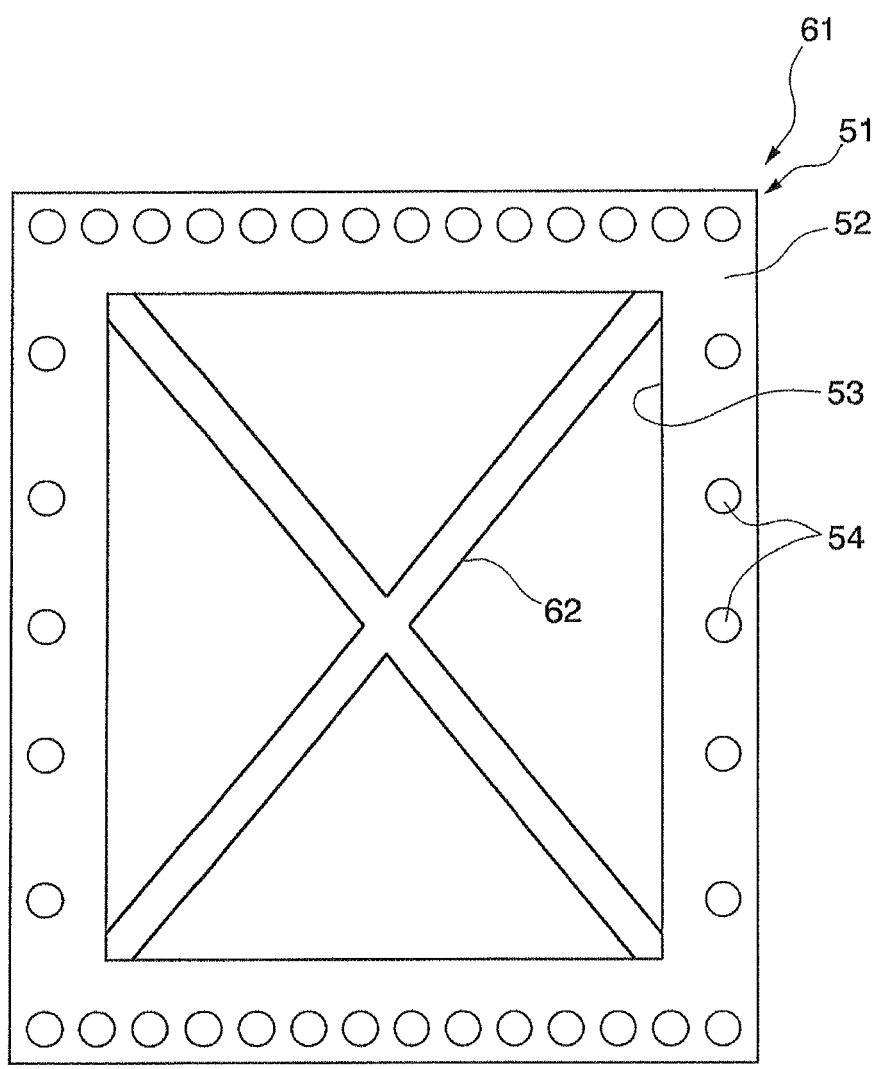
FIG. 6 is a front view showing a modification of a dummy substrate according to the embodiment of the present invention.

FIG. 6 is a plan view showing a modification of the dummy substrate according to the present invention. The dummy substrate 61 is different from the aforementioned dummy substrate 13 in that bars 62 are provided in the opening portion 53. The bars 62 cross each other. The dummy substrate 61 is also capable of having exactly the same advantage as that of the dummy substrate 13. In FIG. 6, the bars 62 are a pair of bars diagonally crossing each other. However, their construction is not limited to this shape. Various modifications can be made in the range in which, when there is an increase in the amount of deposition on the bar 62 of the dummy substrate 61, undesirable situations such as deformation of the dummy substrate 61 due to the stress of the deposition are permitted.

As has been described above, according to the dummy substrate 13, an opening portion 53 with a rectangular shape is formed in a metal plate 52 with a similar shape. Therefore, even while the sputtering apparatus is in operation, there is no possibility of the occurrence of undesirable situations such as glass cracking, making it possible to significantly increase the number of times the dummy substrate is used.

As a result, it is possible to reduce or nullify the stop time of the apparatus when the apparatus is started (activated), the deposition condition is retained/modified, and the apparatus is stopped (deactivated). Thereby, it is possible to enhance the availability of the apparatus.

Furthermore, the contact portion of the carrier 12 with the main unit 51 is covered with the main unit 51. Therefore, it is possible to prevent the deposition of a compound thin film on the contact portion of the carrier 12. As a result, it is possible to prevent undesirable situations such as an abnormal discharge due to the deposition of the compound thin film.

Next, a start method of an inline reactive sputtering apparatus using the dummy substrate 13 will be described, with reference made to the case of the forward cycle by way of example.

First, a target 15, which is a sputtering material for the compound thin film, is attached to the sputtering cathodes 14 in the sputtering zone 6. The target 15 is appropriately selected from among, for example, a tin indium alloy target, an antimony tin alloy target, a titanium target, and magnesium target according to the compound thin film to be deposited.

On the other hand, the dummy substrate is attached to the carrier 12. The carrier 12 is then moved via the anterior chamber 2 to the inlet side zone 5. In the inlet side zone 5, the carrier 12 is moved forward so as to be in close contact with another carrier 12 in the direction of movement thereof, to thereby bring the end faces of the adjacent carriers 12 into close contact with each other.

Subsequently, the sputter deposition chamber 3 including the inlet side zone 5 is decreased in pressure to a predetermined degree of vacuum by use of the vacuum pump 11. Then, the inactive gas introduction pipes 16 and the reactive gas introduction pipes 17 are used to introduce the inactive gas such as Ar and the reactive gas such as $O_2$ into the sputter deposition chamber 3, to thereby put the sputter deposition chamber 3 including the inlet side zone 5 in a mixed gas atmosphere of the inactive gas and the reactive gas with the predetermined pressure, similarly to the anterior chamber 2.

Secondly, the carriers 12 in close contact with each other are moved to the sputtering zone 6. While the carriers 12 are sequentially moved in the sputtering zone 6, the electric power applied to the target 15 is increased stepwise (stepwise application of discharge power). At a stage in which a desired electric power has been achieved, the electric power is stabilized (ramp-up), and also the temperature in the sputtering zone 6 is adjusted, to thereby perform a stabilization of temperature distribution of the structures around the carriers 12 and the target 15 and a stabilization of degassing from the structures around the carriers 12 and the target 15.

At the same time, removal of the adherents on the surface of the target 15 (pre-sputtering) is performed.

As described above, it is possible to perform a start (activation) of the apparatus in a shorter time, and also more efficiently and at a lower cost than before.

Furthermore, it is possible to prevent deposition of a compound thin film on the contact portion of the carrier 12 with the main unit 51. Therefore, it is possible to prevent undesirable situations such as an abnormal discharge due to the deposition of the compound thin film. As a result, it is possible to improve the productivity of the inline reactive sputtering apparatus.

Next is a description of a retention/modification method of a deposition condition in the inline reactive sputtering apparatus using the dummy substrate 13.

First, a retention method of a deposition condition will be described.

After a main sputtering, the dummy substrate 13 is attached to the carrier 12. Then, the carrier 12 is moved via the anterior chamber 2 to the inlet side zone 5. In the inlet side zone 5, the carrier 12 is moved forward so as to be in close contact with another carrier 12 in the direction of movement thereof, to thereby bring the end faces of the adjacent carriers 12 into close contact with each other.

Secondly, the carriers 12 in close contact with each other are moved to the sputtering zone 6. While the carriers 12 are sequentially moved in the sputtering zone 6, a partial pressure of the inactive gas such as Ar and a partial pressure of the reactive gas such as $O_2$ in the sputtering zone 6 are adjusted, to thereby retain a mixed gas atmosphere of the inactive gas and the reactive gas with a predetermined pressure.

Furthermore, the electric power applied to the target 15 is retained and also the temperature in the sputtering zone 6 is adjusted, to thereby perform a stabilization of temperature distribution of the structures around the carriers 12 and the target 15 and a stabilization of degassing from the structures around the carriers 12 and the target 15. After that, if there arises a necessity of performing a main sputtering, the dummy substrates 13 are replaced with desired substrates and a main sputtering is performed. Furthermore, to modify a deposition condition, the carriers 12 are moved to the sputtering zone 6 as described above. Then, while the carriers 12 are sequentially moved in the sputtering zone 6, a partial pressure of the inactive gas such as Ar and a partial pressure of the reactive gas such as $O_2$ in the sputtering zone 6 are adjusted, to thereby make a modification to a mixed gas atmosphere of the inactive gas and the reactive gas with a predetermined pressure.

Moreover, the electric power applied to the target 15 is modified and also the temperature in the sputtering zone 6 is adjusted, to thereby perform a stabilization of temperature distribution of the structures around the carriers 12 and the target 15 and a stabilization of degassing from the structures around the carriers 12 and the target 15. After that, if there occurs a necessity of performing a main sputtering, the dummy substrates 13 are replaced with desired substrates and a main sputtering is performed.

As described above, it is possible to retain/modify a deposition condition of the present sputtering more efficiently and at a lower cost than before.

Furthermore, it is possible to prevent deposition of a compound thin film on the carrier 12. Therefore, it is possible to prevent undesirable situations such as an abnormal discharge due to the deposition of the compound thin film. As a result, it is possible to improve the productivity of the inline reactive sputtering apparatus.

Next is a description of a stop method of an inline reactive sputtering apparatus using the dummy substrate 13.

After a main sputtering, the dummy substrate 13 is attached to the carrier 12. Then, the carrier 12 is moved via the anterior chamber 2 to the inlet side zone 5. In the inlet side zone 5, the carrier 12 is moved forward so as to be in close contact with another carrier 12 in the direction of movement thereof, to thereby bring the end faces of the adjacent carriers 12 into close contact with each other.

Subsequently, the carriers 12 in close contact with each other are moved to the sputtering zone 6. While the carriers 12 are sequentially moved in the sputtering zone 6, the electric power applied to the target 15 is stopped, and the inside of the sputter deposition chamber 3 including the sputtering zone 6 is cooled.

After confirming that the inside of the sputter deposition chamber 3 is cooled to a predetermined temperature or lower, the supplies of the inactive gas such as Ar and the reactive gas such as $O_2$ are stopped.

As described above, even when the sputtering apparatus is stopped, the dummy substrate 13 continues to cover the contact portion with the carrier 12. Thereby, it is possible to prevent deposition of a substance left in the sputter deposition chamber 3, especially a compound thin film, on the contact portion of the carrier 12 with a substrate. Therefore, it is possible to prevent undesirable situations such as an abnormal discharge due to the deposition of the compound thin film. As a result, it is possible to improve the productivity of the apparatus.

Note that in the present embodiment, an inline reactive sputtering apparatus has been described by way of example as a sputtering apparatus to which the dummy substrate of the present invention is applied. However, obviously, the present invention is also applicable to sputtering apparatuses other than a reactive sputtering apparatus.

INDUSTRIAL APPLICABILITY

According to a dummy substrate, a start method of, a retention/modification method of a deposition condition, and a stop method of a deposition apparatus using the same of the present invention, it is possible to start (activate) an apparatus that deposits a compound thin film by the sputtering method, retain and modify a deposition condition in the apparatus, and stop (deactivate) the apparatus in a shorter time, and also more efficiently and at a lower cost than before.

What is claimed is:

1. A dummy substrate for use in an apparatus where a plurality of transfer devices for holding substrates are arranged in a sputter deposition chamber in a line along one direction on surfaces of the substrates and where a compound thin film is deposited on the surfaces of the substrates by a sputtering method in a state with the transfer devices being sequentially moved or being stationary, the dummy substrate being used instead of any one of the held substrates, comprising:
a main unit portion having a first part including a metal frame defining a perimeter of an opening extending through a thickness of said first part, said opening disposed at the center of the main unit portion, the metal frame having a generally rectangular-plate-like frame structure, the opening having a generally rectangular shape generally corresponding to an outer peripheral shape of the metal frame;
wherein each edge of the perimeter of the first part has a plurality of circular discrete areas onto which adsorption pads of the transfer devices is configured to adsorb, the plurality of discrete areas having a surface roughness Ra of no more than 3.2 µm and being formed at only positions corresponding to positions of the adsorption pads.

2. The dummy substrate according to claim 1, wherein the main unit portion of the dummy substrate used instead of the held substrates has an outer peripheral shape equivalent to that of the held substrates, and has a weight equivalent to that of the held substrates.

3. The dummy substrate according to Claim 1, further comprising:
a pair of bars crossed each other along a surface of the first part and provided in the opening of the main unit portion.

4. A start method of a deposition comprising:
arranging, in a sputter deposition chamber, a plurality of transfer devices holding a plurality of dummy substrates in a line along one direction on surfaces of the dummy substrates, wherein each of said dummy substrates comprises a main unit portion having a first part including a metal frame defining a perimeter of an opening extending through a thickness of said first part, said opening disposed at the center of the main unit portion, the metal frame having a generally rectangular-plate-like frame strcuture, the opening having a generally rectangular shape generally corresponding to an outer peripheral shape of the metal frame, wherein each edge of the perimeter of the first part has a plurality of circular discrete areas onto which adsorption pads of the transfer devices is configured to adsorb, the plurality of discrete areas having a surface roughness Ra of no more than 3.2 µm and being formed at only positions corresponding to positions of the adsorption pads;
changing a deposition condition in a state with the transfer devices being sequentially moved or being stationary; and
then stabilizing the deposition condition into a desired deposition condition.

5. A method of retaining or modifying a deposition condition in a deposition apparatus comprising:
causing a plurality of transfer devices to hold a plurality of dummy substrates after a main sputtering, wherein each of said dummy substrates comprises
a main unit portion having a first part including a metal frame defining a perimeter of an opening extending through a thickness of said first part, said opening disposed at the center of the main unit portion, the metal frame having a generally rectangular-plate-like frame structure, the opening having a generally rectangular shape generally corresponding to an outer peripheral shape of the metal frame, wherein each edge of the perimeter of the first part has a plurality of circular discrete areas onto which adsorption pads of the transfer devices is configured to adsorb, the plurality of discrete areas having a surface roughness Ra of no more than 3.2 µm and being formed at only positions corresponding to positions of the adsorption pads;
arranging, in a sputter deposition chamber, the transfer devices holding the dummy substrates in a line along one direction on surfaces of the dummy substrates;
retaining or modifying a deposition condition in a state with the transfer devices being sequentially moved or being stationary; and
then replacing the dummy substrates with desired substrates, and performing a main sputtering.

6. A stop method of a depositiong comprising:
arranging, in a sputter deposition chamber, a plurality of transfer devices holding a plurality of dummy substrates in a line along one direction on surfaces of the dummy substrates, wherein each of said dummy substrates comprises a main unit portion having a first part including a metal frame defining a perimeter of an opening extending through a thickness of said first parts, said opening disposed at the center of the main unit portion, the metal frame having a generally rectangular-plate-like frame structure, the opening having a generally rectangular shape generally corresponding to an outer peripheral shape of the metal frame, wherein each edge of the perimeter of the first part has a plurality of circular discrete areas onto which adsorption pads of the transfer devices is configured to adsorb, the plurality of discrete areas having a surface roughness Ra of no more than 3.2 µm and being formed at only positions corresponding to positions of the adsorption pads;
cooling an inside of the sputter deposition chamber in a state with the transfer devices being sequentially moved or being stationary; and
then stopping the deposition apparatus.

* * * * *